United States Patent
Gutsche et al.

(10) Patent No.: US 6,916,704 B2
(45) Date of Patent: Jul. 12, 2005

(54) MULTIPLE DEPOSITION OF METAL LAYERS FOR THE FABRICATION OF AN UPPER CAPACITOR ELECTRODE OF A TRENCH CAPACITOR

(75) Inventors: Martin Gutsche, Dorfen (DE); Bernhard Sell, Dresden (DE); Annette Sänger, Dresden (DE); Harald Seidl, Feldkirchen (DE)

(73) Assignee: Infineon Technologies AG, Munich (DE)

( * ) Notice: Subject to any disclaimer, the term of this patent is extended or adjusted under 35 U.S.C. 154(b) by 416 days.

(21) Appl. No.: 10/167,800

(22) Filed: Jun. 12, 2002

(65) Prior Publication Data

US 2002/0187605 A1 Dec. 12, 2002

(30) Foreign Application Priority Data

Jun. 12, 2001 (DE) .......................... 101 28 326

(51) Int. Cl.⁷ .................... H01L 21/8242; H01L 21/20; H01L 21/44

(52) U.S. Cl. .................. 438/253; 438/396; 438/240; 438/647; 438/685

(58) Field of Search ............................... 438/253–259, 438/396, 399, 240, 647–648, 685, 902

(56) References Cited

U.S. PATENT DOCUMENTS

| | | | | |
|---|---|---|---|---|
| 5,593,924 A | * | 1/1997 | Apte et al. | 438/647 |
| 5,631,479 A | | 5/1997 | Shiga | |
| 5,905,279 A | * | 5/1999 | Nitayama et al. | 257/301 |
| 5,976,928 A | * | 11/1999 | Kirlin et al. | 438/240 |
| 6,100,200 A | | 8/2000 | Van Buskirk et al. | |
| 6,674,113 B2 | * | 1/2004 | Goldbach et al. | 257/301 |

OTHER PUBLICATIONS

Yamada, K. et al.: "A Deep–Trenched Capacitor Technology For 4 Mega Bit Dynamic Ram", IEEE, 1985, 29.3, pp. 702–705.

Ishiuchi, H. et al.: "Submicron CMOS Technologies For Four Mega Bit Dynamic Ram", IEEE, 1985, 29.4, pp. 706–709.

* cited by examiner

Primary Examiner—Michael S. Lebentritt
Assistant Examiner—Ron Pompey
(74) Attorney, Agent, or Firm—Laurence A. Greenberg; Werner H. Stemer; Ralph E. Locher (57) ABSTRACT

An upper capacitor electrode of a trench capacitor of a DRAM memory cell is formed at least in part as a result of a plurality of metal-containing layers being deposited one on top of another and in each case being conditioned after they have been deposited. In this way, the internal stress of the electrode layer can be reduced, and therefore a breaking strength and a resistance to leakage currents of the trench capacitor can be increased.

7 Claims, 7 Drawing Sheets

MULTIPLE DEPOSITION OF METAL LAYERS FOR THE FABRICATION OF AN UPPER CAPACITOR ELECTRODE OF A TRENCH CAPACITOR

BACKGROUND OF THE INVENTION

Field of the invention

The present invention relates to a method for fabricating a trench capacitor for a dynamic random access memory (DRAM) memory cell. A trench is formed in a substrate and a lower capacitor electrode that adjoins a wall of the trench is provided in a lower trench region. A storage dielectric and an upper capacitor electrode are than produced.

In dynamic random access memory cell configurations, it is known to virtually exclusively use what are known as single-transistor memory cells. A single-transistor memory cell contains a read transistor and a storage capacitor. Information is stored in the storage capacitor in the form of an electric charge that represents a logic 0 or a logic 1. Actuating the read transistor via a word line allows the information to be read via a bit line. The storage capacitor must have a minimum capacitance for reliable storage of the charge and, at the same time, to make it possible to differentiate the information item that has been read. The lower limit for the capacitance of the storage capacitor is currently considered to be 25 fF.

Since the storage density increases from memory generation to memory generation, the surface area required by the single-transistor memory cell must be reduced from generation to generation. At the same time, the minimum capacitance of the storage capacitor has to be retained.

Up to the 1 Mbit generation, both the read transistor and the storage capacitor have been produced as planar components. Beyond the 4 Mbit memory generation, the area taken up by the memory cell was reduced further by using a three-dimensional configuration of the read transistor and the storage capacitor. One possibility is for the capacitor to be produced in a trench (see for example the reference by K. Yamada et al., Proc. Intern. Electronic Devices and Materials IEDM 85, pp. 702). In this case, a diffusion region that adjoins the wall of the trench and a doped polysilicon filling disposed in the trench act as electrodes for the storage capacitor. Therefore, the electrodes of the storage capacitor are disposed along the surface of the trench. In this way, the effective surface area of the storage capacitor, on which the capacitance is dependent, is increased with respect to the space taken up by the storage capacitor on the surface of the substrate, which corresponds to the cross section of the trench. Although there are limits on the extent to which the depth of the trench can be increased, for technological reasons, the packing density can be further increased by reducing the cross section of the trench.

However, one difficulty associated with the decreasing trench cross section is the increasing electrical resistance of the trench filling and the associated increase in the read-out time of the DRAM memory cell. Therefore, to ensure a high read-out speed as the trench cross section is further reduced in size, it is necessary to select materials with a lower resistivity as electrodes of the trench capacitor. It has to be possible for the materials to be deposited at very high aspect ratios that are typically used in trench capacitors. Many materials that are in principle suitable for this purpose experience a great amount of stress during deposition and subsequent heat treatment. The stress may lead to the metal layers flaking off, to an increase in leakage currents, for example as a result of stress in the capacitor dielectric, or even to the wafer fracturing.

U.S. Pat. No. 5,905,279 discloses a memory cell having a storage capacitor disposed in a trench and a select transistor, in which the storage capacitor has a lower capacitor electrode, which adjoins a wall of the trench, a capacitor dielectric and an upper capacitor electrode. The upper capacitor electrode contains a layer stack containing polysilicon, a metal-containing, electrically conductive layer, in particular made from WSi, TiSi, W, Ti or TiN, and polysilicon. The trench capacitor is fabricated by first forming the upper capacitor electrode in the lower trench region. Then, an insulating collar is deposited in the upper trench region, and next the upper capacitor electrode is completed. Alternatively, the method is carried out on an silicon-on-insulator (SOI) substrate which does not have an insulating collar, in which case the upper capacitor electrode, which contains a lower polysilicon layer and a tungsten silicide filling, is fabricated in a single-stage deposition method, in which the individual layers are deposited entirely in the trench.

However, the reduction in the series resistance of the upper capacitor electrode that can be achieved with this method is not yet satisfactory. Moreover, the method may also give rise to a very high level of stress, which can lead to considerable process engineering problems.

SUMMARY OF THE INVENTION

It is accordingly an object of the invention to provide a multiple deposition of metal layers for the fabrication of an upper capacitor electrode of a trench capacitor which overcomes the above-mentioned disadvantages of the prior art methods of this general type, in which a substantially constant read-out speed can be retained even when the trench cross section is reduced in size. In particular, the fabrication method is to allow a series resistance of the upper capacitor electrode to be reduced while the resistance to leakage currents and failures of the DRAM memory cell remains the same or is even improved.

With the foregoing and other objects in view there is provided, in accordance with the invention, a method for fabricating a trench capacitor for a dynamic random access memory (DRAM) memory cell. The method includes the steps of: providing a substrate; forming a trench in the substrate; providing a lower capacitor electrode which adjoins a wall of the trench in a lower trench region; providing a storage dielectric on the lower capacitor electrode; and providing an upper capacitor electrode on the storage dielectric. The upper capacitor electrode has a plurality of metal-containing layers deposited one on top of another. Each of the metal-containing layers is conditioned after each of the metal-containing layers has been deposited and before a next metal-containing layer is deposited.

A further object of the present invention is to describe a method for fabricating a metal-containing, electrically conductive layer having a reduced internal stress. one significant aspect of the invention relates to the fabrication of a trench capacitor for use in a DRAM memory cell, a trench being formed in a substrate, and a lower capacitor electrode, which adjoins a wall of the trench in the lower trench region, a storage dielectric and an upper capacitor electrode being provided. The upper capacitor electrode has a plurality of metal-containing layers that are deposited on top of one another and are in each case conditioned after they have been deposited.

The upper capacitor electrode therefore has a metal layer that is deposited in a multistage process involving successive deposition and conditioning. The desired overall thickness of the combined metal-containing electrode layer is divided into a number of partial layers that are produced on top of one another and processed in this manner. The stress in the metal layers is highest when a phase transition takes place in the metal during a conditioning step following the deposition. Once the phase transition has been concluded, only a relatively small amount of stress occurs during further conditioning. In the method according to the invention, the stress is distributed over a plurality of process steps that are carried out in succession. For example, if a 40 nm thick metal layer is to be deposited, conditioning can be carried out after in each case 10 nm of metal have been deposited. Since the stress that is generated is approximately proportional to the layer thickness, the stress is in this case reduced roughly by a factor of 4.

A significant advantage of the method according to the invention resides in the reduced stress in the metallic layer that is produced, so that the risk of the metallic layer peeling off and of the wafer fracturing is considerably reduced.

Furthermore, the stress between the metallic layer and the layer below it is also reduced. For example, if the layer below it is the storage dielectric, the load on the latter during processing is reduced, with the result that the leakage current properties of the DRAM memory cell are improved.

A further advantage is that in general multiple deposition and processing of partial layers makes it possible to produce metal layers which are more homogeneous than if they are produced in a single-stage process. The method is particularly suitable for relatively slow processes, since the layer thickness can then be controlled very successfully. Such slow processes usually have very good edge coverage on substrates with strong topography.

In one embodiment of the fabrication of a trench capacitor, a polycrystalline silicon layer is deposited on the storage dielectric in the trench, as a bottom layer of the upper capacitor electrode. Then, the first metal-containing layer is deposited on the polycrystalline silicon layer and conditioned. In this embodiment, therefore, the bottom layer of the upper capacitor electrode is not a metal-containing layer, but rather the above-mentioned polycrystalline silicon layer. This takes account of the problem that the storage dielectric may be damaged by the conditioning steps as a result of direct contact between the metal and the storage dielectric.

Alternatively, however, it is also possible in principle for the first metal layer to be deposited directly on the storage dielectric.

In accordance with an added mode of the invention, a doped polycrystalline silicon layer is formed on the metal-containing layers, and the doped polycrystalline silicon layer forms a top layer of the upper capacitor electrode.

In accordance with a further mode of the invention, a spacer layer having an insulating material is formed in an upper trench region.

The metal layers that are deposited in the trenches and conditioned may, for example, be formed by tungsten or tungsten silicide layers.

The conditioning steps that are carried out on the metal-containing layers may, for example, be brought about by rapid thermal processing (RTP) steps at approximately 900° C.

The method according to the invention can be applied both to planar structures and to structures with a pronounced topography, such as the above-mentioned trench capacitors. Therefore, a further aspect of the present invention relates to a method for fabricating a metal-containing, electrically conductive layer, in which a plurality of metal-containing partial layers are deposited on top of one another and are in each case conditioned after they have been deposited. The target thickness of the metal-containing, electrically conductive layer that is to be produced is achieved by multiple repetition of the process sequence of deposition and conditioning of individual metal-containing partial layers. The starting point is a substrate which has been pre-processed according to the particular application and on which, for example, there is a gate dielectric, a storage dielectric with, if appropriate, a polycrystalline silicon layer or the like above it. First metal layers could also already have been deposited on the substrates.

Accordingly, the method can be used in the fabrication of any type of microtechnology structure in which an electrically conductive, low-stress layer is to be produced. One example of a microtechnology structure of this type is a MOS semiconductor transistor, the gate electrode of which can be fabricated using the method according to the invention. The MOS semiconductor transistor is formed along with the trench capacitor to form a DRAM.

The metal-containing layers that are to be deposited in succession in this way do not necessarily contain the same material, but rather may also be formed from different materials.

Other features which are considered as characteristic for the invention are set forth in the appended claims.

Although the invention is illustrated and described herein as embodied in a multiple deposition of metal layers for the fabrication of an upper capacitor electrode of a trench capacitor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERED EMBODIMENTS

Figure 1:
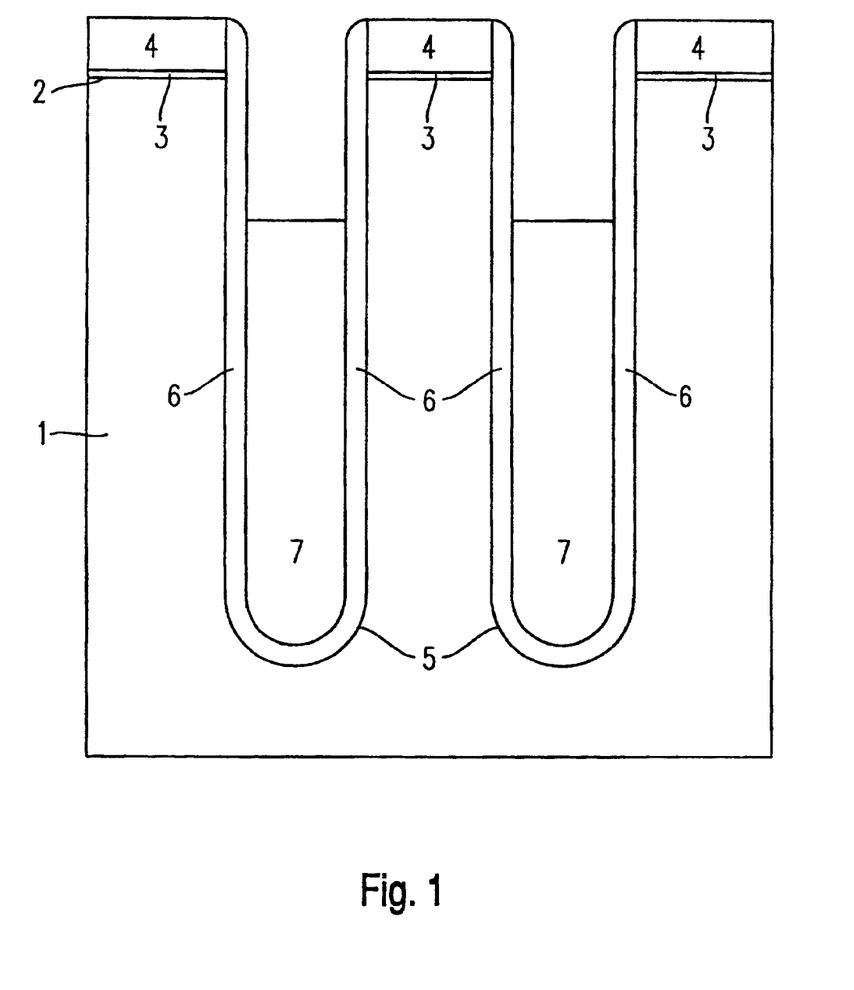
FIGS. 1–6 are diagrammatic, sectional views showing individual steps involved in a fabrication of a trench capacitor according to the invention.

Referring now to the figures of the drawing in detail and first, particularly, to FIG. 1 thereof, there is shown a silicon substrate 1 with a main surface 2. A 5 nm thick $SiO_2$ layer 3 and a 200 nm thick $Si_3N_4$ layer 4 are applied to the main surface 2. Then, a 1000 nm thick non-illustrated BSG layer is applied as a hard mask material.

Using a non-illustrated mask produced by photolithography, the BSG layer, the $Si_3N_4$ layer 4 and the $SiO_2$ layer 3 are patterned in a plasma etching process using $CF_4/CHF_3$, so that a hard mask is formed. After removal of the mask produced by photolithography, trenches 5 are etched into the main surface 1 in a further plasma etching process using $HBr/NF_3$ using the hard mask as an etching mask. Then, the BSG layer is removed by a wet etch using $H_2SO_4/HF$.

The depth of the trenches 5 is, for example, 5 μm, their width is 100×250 nm and they are spaced apart from one another by 100 nm.

Next, a 10 nm thick $SiO_2$ layer 6, which may also be doped, for example by in-situ doping, is deposited. The deposited $SiO_2$ layer 6 covers at least the walls of the trenches 5. Deposition of a 200 nm thick polysilicon layer, chemical mechanical polishing down to the surface of the $Si_3N_4$ layer 4 and etching back of the polysilicon layer using $SF_6$ results in a polysilicon filling 7 being produced in each of the trenches 5, the surface of the polysilicon filling 7 is disposed 1000 nm below the main surface 2. If appropriate, the chemical mechanical polishing can be dispensed with. The polysilicon filling 7 is used as a sacrificial layer for the subsequent $Si_3N_4$ spacer deposition. Next, the $SiO_2$ layer 6 on the walls of the trenches 5 is etched isotropically.

Then, a chemical vapor deposition (CVD) process is used to deposit a 20 nm thick spacer layer 9, which contains silicon nitride and/or silicon dioxide, and the spacer layer 9 is etched in an anisotropic plasma etching process using $CHF_3$. The spacer layer 9 that has just been deposited is used, in the finished memory cell, to disconnect the parasitic transistor that would otherwise form at this location, and therefore forms the insulating collar 9.

Figure 2:
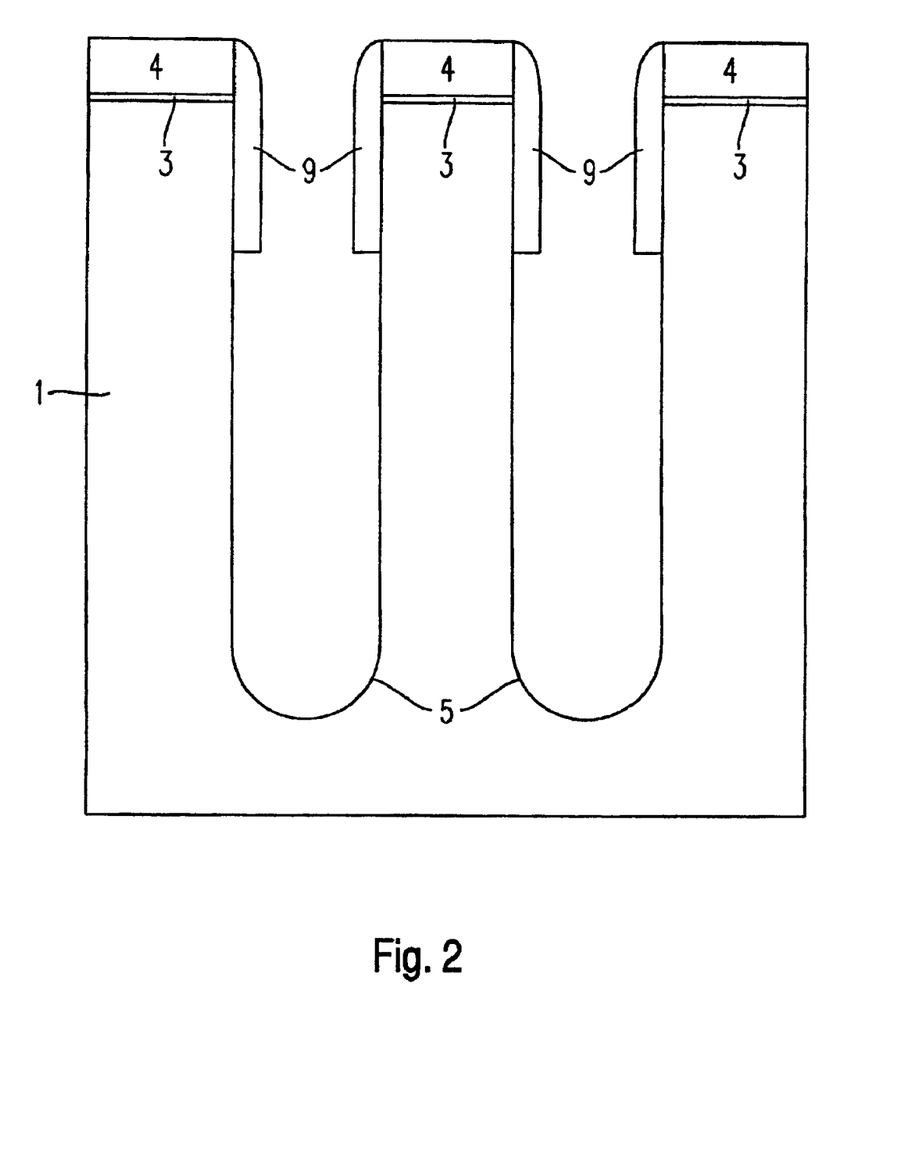

Then, $SF_6$ is used to etch the polysilicon selectively with respect to $Si_3N_4$ and $SiO_2$. In the process, the polysilicon filling 7 is in each case removed completely from the trench 5. That part of the $SiO_2$ layer that has now been uncovered is removed by etching using $NH_4F/HF$ (see FIG. 2).

Figure 3:
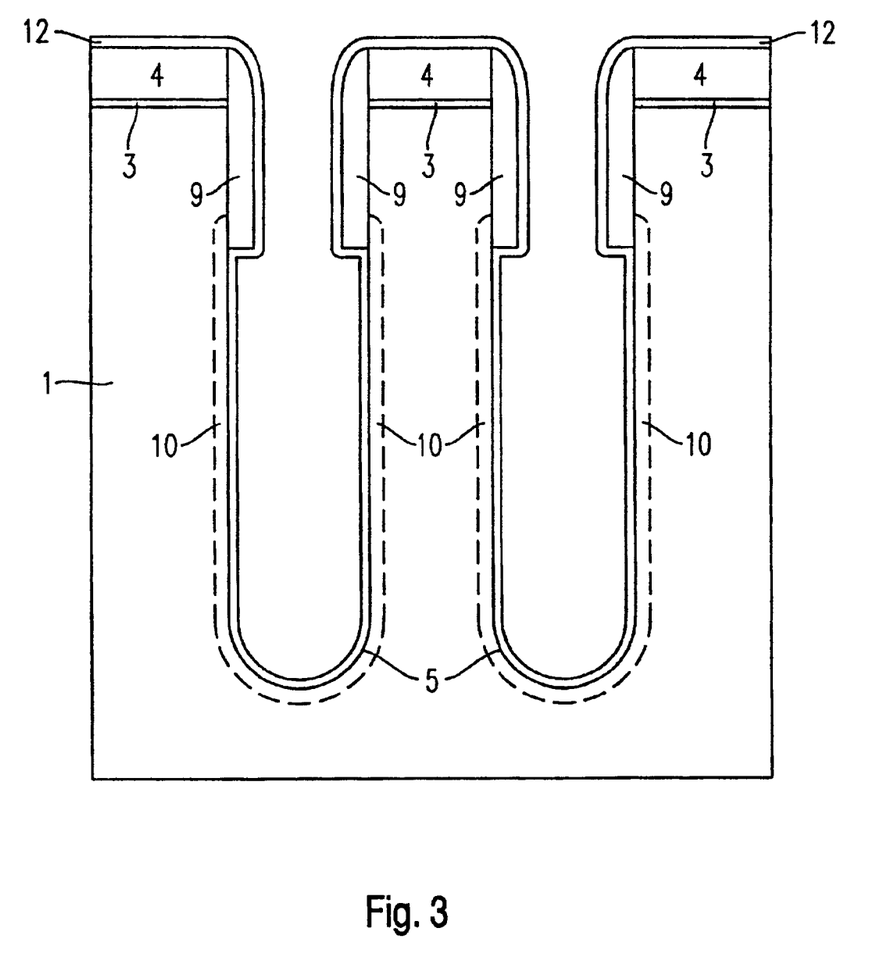

If appropriate, to widen the trenches 5 in their lower region, i.e. in the region remote from the main surface 2, silicon is then etched selectively with respect to the spacer layer 9 (see FIG. 3). This is affected, for example, by an isotropic etching step using ammonia, in which silicon is etched selectively with respect to $Si_3N_4$. The etching time is such that 20 nm of silicon is etched. In this way, the cross section is widened by 40 nm in the lower region of the trenches 5. As a result, the capacitor area and therefore the capacitance of the capacitor can be increased further. The collar 9 may also be produced by other processes, such as for example local oxidation (LOCOS) or collar formation during the trench etching.

The drawings illustrate the process sequence with unwidened trenches.

Then, if this has not already been affected by the doped oxide, the silicon substrate is doped. This can be achieved, for example, by depositing an arsenic-doped silicate glass layer in a layer thickness of 50 nm and a $TEOS-SiO_2$ layer in a thickness of 20 nm, followed by a heat treatment step at 1000° C., 120 seconds, with the result that, as a result of diffusion out of the arsenic-doped silicate glass layer, an n-doped region 10 is formed in the silicon substrate 1. Alternatively, it is also possible to carry out vapor-phase doping, for example using the following parameters: 900° C., 399 Pa, tributylarsine (TBA) [33 percent], 12 min.

A first object of the $n^+$-doped region 10 is to reduce the size of the depletion zone, so that a capacitance of a capacitor is increased further. Second, the high doping concentration, which is of the order of magnitude of $10^{19}$ $cm^{-3}$, allows a lower capacitor electrode to be provided, if it is not to be metallic. If it is metallic, the high level of doping produces an ohmic contact. The required doping for the ohmic contact is approximately $5×10^{19}$ $cm^{-3}$.

Alternatively, the lower capacitor electrode may also be produced by deposition of an electrically conductive layer, as has been described, for example, in Published, Non-Prosecuted German Patent Application DE 199 44 012 A1.

Next, a 5 nm thick dielectric layer 12, which contains $SiO_2$ and $Si_3N_4$ and also, if appropriate, silicon oxynitride, is deposited as the capacitor dielectric. The layer sequence can lib be realized by steps of nitride deposition and of thermal oxidation, in which defects in the layer below are annealed. As an alternative, the dielectric layer 12 contains $Al_2O_3$ (aluminum oxide), $TiO_2$ (titanium dioxide), $TaO_5$ (tantalum oxide). In any event, the capacitor dielectric 12 is deposited over the entire surface, so that it completely covers the trench 5 and the surface of the silicon nitride layer 4 (see FIG. 3).

Figure 4:
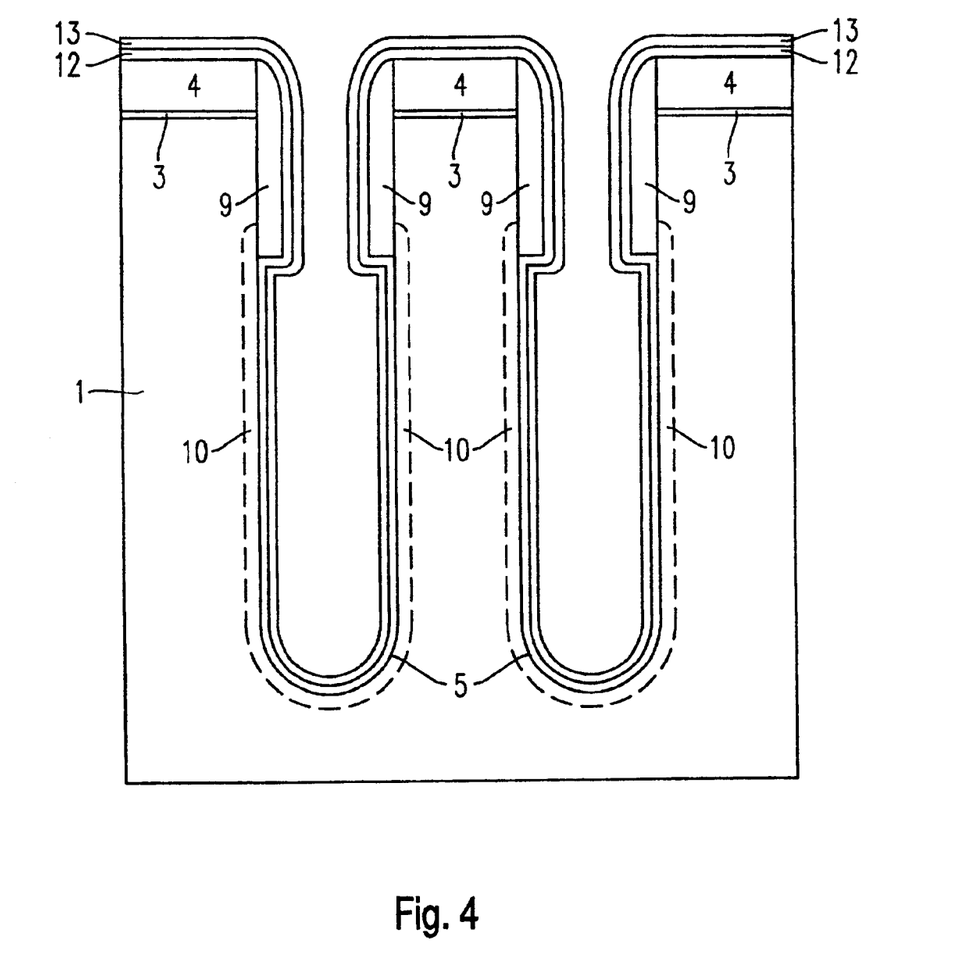

Then, in FIG. 4, the formation of an upper capacitor electrode 18 begins. In the exemplary embodiment illustrated, the electrode has two metal-containing layers 14 and 15 which have been deposited and processed in accordance with the invention and are formed as tungsten silicide layers.

First, a doped polysilicon layer 13 is initially deposited in a thickness of approximately 20 nm. The layer may, for example, be deposited if there were to be an expectation that the dielectric could be adversely affected or damaged during a heat treatment by metal deposited directly on it. The thickness of the first polysilicon layer 13 may also be reduced or, if appropriate, the layer may be omitted altogether.

Figure 5:
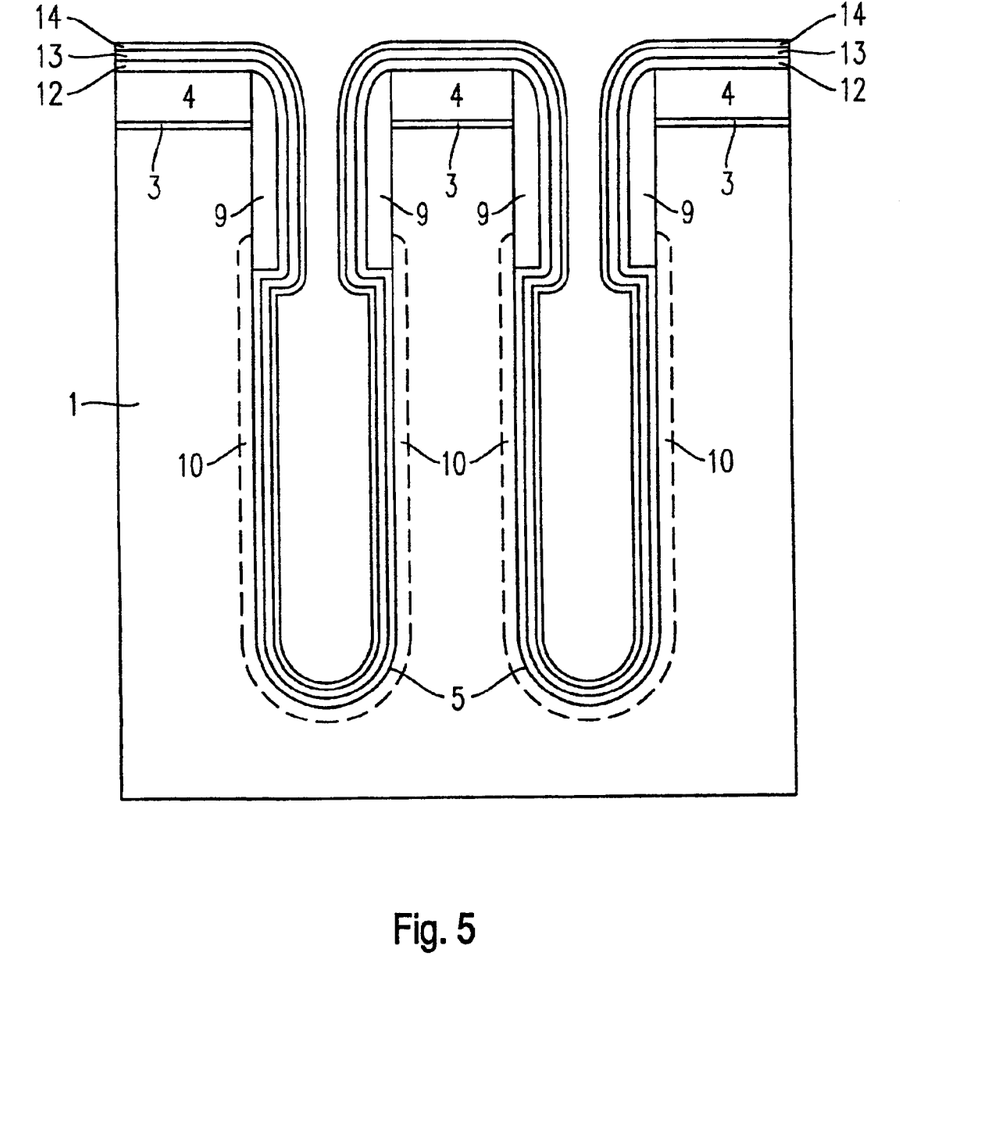

Then, as shown in FIG. 5, a first tungsten silicide layer 14, with a thickness of approximately 10 nm (FIG. 5), is deposited is on the polycrystalline silicon layer 13, and next a conditioning step is carried out in an inert or nitrogen atmosphere, for example at approximately 900° C. The conditioning step may also be carried out as an RTP step. After conditioning, the surface of the tungsten silicide layer 14 can be cleaned in order to improve the interface between the metal layers.

Figure 6:
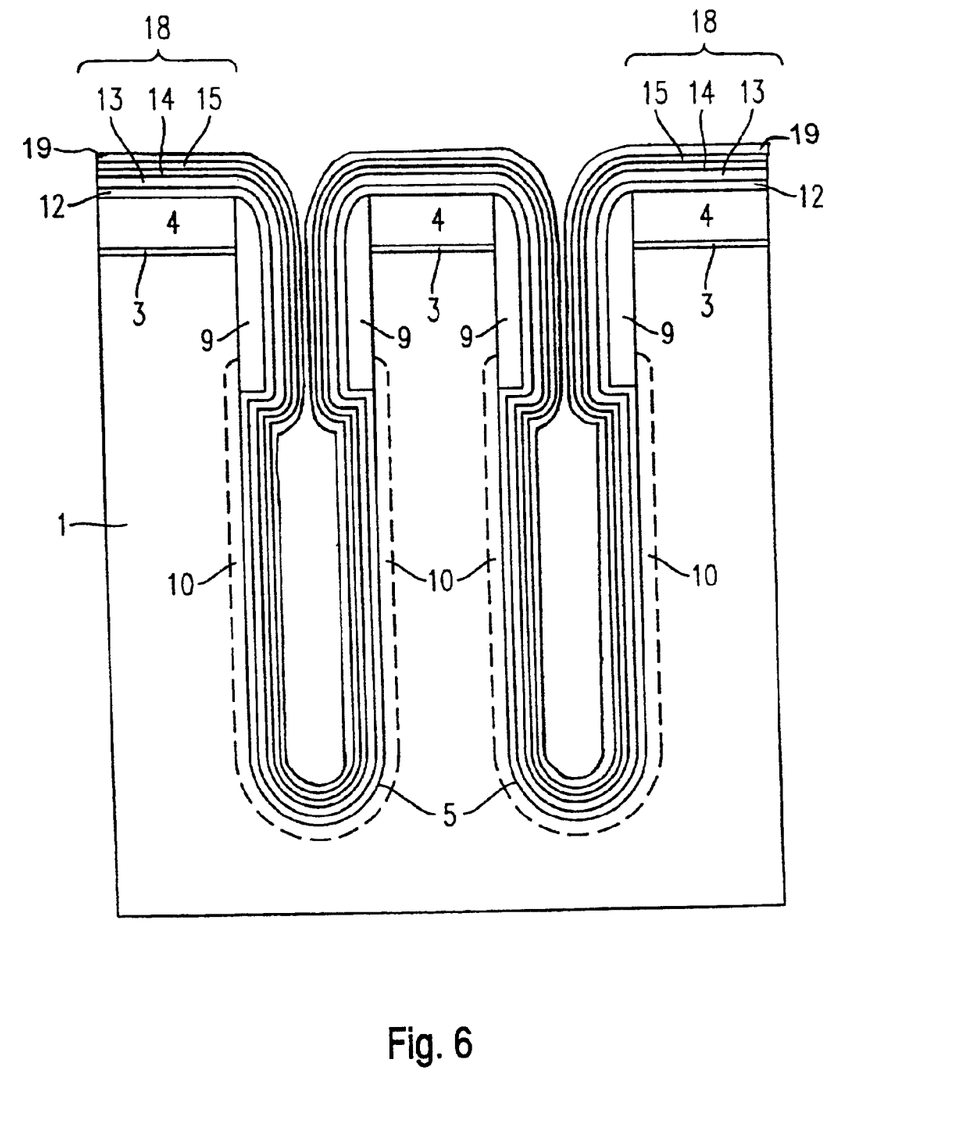

As shown in FIG. 6, a second tungsten silicide layer 15 is deposited and then conditioned in the same way.

Then, if desired, further metal-containing layers can be deposited in accordance with the invention, until the layers grow together in the upper trench region, so as to form a cavity in the lower trench region. However, it is also possible for a polysilicon layer 19 to be deposited as the final, upper layer of the upper capacitor electrode 18.

The further processing of the trench capacitor and its connection to a select transistor which is yet to be formed are known per se from the prior art and do not require any further explanation. By way of example, reference is made to Published, Non-Prosecuted German Patent Application DE 199 44 012 A1, in particular to FIGS. 2E–I and 3 to 5, and is hereby incorporated herein.

Figure 7:
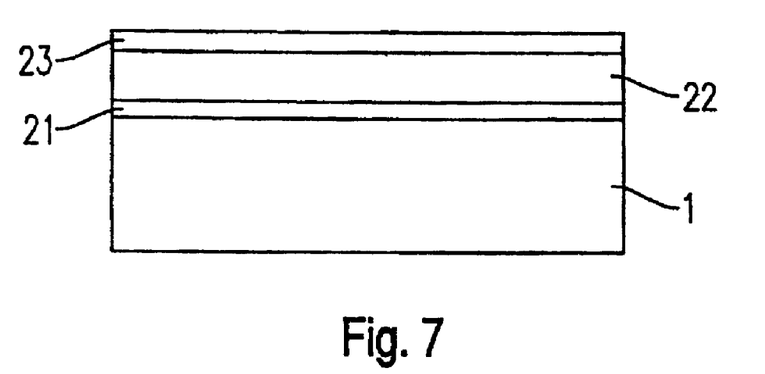
FIGS. 7 and 8 are sectional views showing the individual steps involved in the fabrication of a gate electrode.
Figure 8:
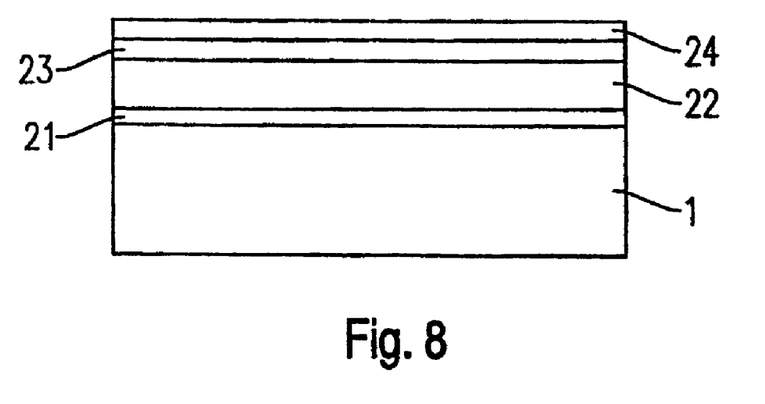

The inventive processing of a gate electrode that is to be used as part of a MOS semiconductor transistor is described with reference to FIGS. 7 and 8.

First, a heat treatment in an oxygen atmosphere is used to form a $SiO_2$ layer 21 as a gate oxide on the silicon substrate 1. Then, a doped polysilicon layer 22 is deposited on the oxide layer. Then, a first thin metal-containing layer 23, for example a tungsten or tungsten silicide layer, is initially deposited on the doped polysilicon layer 22, as shown in FIG. 7, and next a conditioning step is carried out, for example as an RTP process at approximately 900° C. in an inert-gas atmosphere. Then, a second metal-containing layer 24 is deposited on the first metal-containing and conditioned layer 23, and the second layer 24 is likewise conditioned after it has been deposited. Then, if desired, still further metal-containing layers can be deposited in the manner described and conditioned until a desired target thickness of the gate electrode is achieved.

After the deposition and conditioning of the metal-containing layer, a cleaning process can be carried out in order to improve the interface with the layer that is then to be applied.

In this case too, the polysilicon layer was deposited because, under certain circumstances, direct deposition of metal on the dielectric may adversely affect or damage the functionality of the dielectric during subsequent conditioning processes. In principle, however, the metal layers may also be deposited directly on the dielectric layer and conditioned.

We claim:

1. A method for fabricating a trench capacitor for a dynamic random access memory (DRAM) memory cell, which comprises the steps of:

providing a substrate;

forming a trench in the substrate;

providing a lower capacitor electrode which adjoins a wall of the trench in a lower trench region;

providing a storage dielectric on the lower capacitor electrode;

providing an upper capacitor electrode on the storage dielectric, the upper capacitor electrode having a plurality of metal-containing layers deposited one on top of another; and thermally heating each of the metal-containing layers after each of the metal-containing layers has been deposited and before a next metal-containing layer is deposited.

2. The method according to claim 1, which comprises forming a doped polycrystalline silicon layer on the storage dielectric, the doped polycrystalline silicon layer forming a bottom layer of the upper capacitor electrode.

3. The method according to claim 1, which comprises forming a doped polycrystalline silicon layer on the metal-containing layers, and the doped polycrystalline silicon layer forming a top layer of the upper capacitor electrode.

4. The method according to claim 1, which comprises forming at least one of the metal-containing layers from a material selected from the group consisting of tungsten and tungsten silicide.

5. The method according to claim 1, which comprises forming a spacer layer having an insulating material in an upper trench region.

6. The method according to claim 1, which comprises conditioning the metal-containing layers using a rapid thermal processing step.

7. A method for fabricating a dynamic random access memory (DRAM) memory cell, which comprises the steps of:

providing a substrate;

forming a trench capacitor in the substrate, the trench capacitor having a lower capacitor electrode adjoining a wall of the trench in a lower trench region, a storage dielectric, and an upper capacitor electrode, the upper capacitor electrode having a plurality of metal-containing layers deposited one on top of one another;

thermally heating each of the metal-containing layers after each of the metal-containing layers has been deposited and before a next metal-containing layer is deposited; and forming a selection transistor in the substrate.

* * * * *